United States Patent
Taniguchi et al.

(10) Patent No.: US 7,172,841 B2
(45) Date of Patent: *Feb. 6, 2007

(54) CRYSTALLIZATION APPARATUS, CRYSTALLIZATION METHOD, AND PHASE SHIFT MASK

(75) Inventors: Yukio Taniguchi, Yokohama (JP); Masakiyo Matsumura, Yokohama (JP); Yoshinobu Kimura, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 296 days.

This patent is subject to a terminal disclaimer.

(21) Appl. No.: 10/734,248

(22) Filed: Dec. 15, 2003

(65) Prior Publication Data

US 2004/0126674 A1 Jul. 1, 2004

Related U.S. Application Data

(63) Continuation of application No. PCT/JP03/03366, filed on Mar. 19, 2003.

(30) Foreign Application Priority Data

Apr. 23, 2002 (JP) .............................. 2002-120312

(51) Int. Cl.
   *G03F 1/00* (2006.01)
(52) U.S. Cl. ........................................................ 430/5
(58) Field of Classification Search .................. 430/5; 359/443, 883; 438/166; 117/201
   See application file for complete search history.

(56) References Cited

U.S. PATENT DOCUMENTS

| 6,057,063 A | * | 5/2000 | Liebmann et al. | ............. 430/5 |
| 6,248,606 B1 | | 6/2001 | Ino et al. | |
| 6,749,971 B2 | * | 6/2004 | Lukanc et al. | ............. 430/5 |
| 2004/0126674 A1 | * | 7/2004 | Taniguchi et al. | ............. 430/5 |

FOREIGN PATENT DOCUMENTS

| EP | 0 035 561 | 9/1981 |
| EP | 1 047 119 A2 | 10/2000 |

OTHER PUBLICATIONS

Mitsuru Nakata et al., A New Nucleation-Site-Control Excimer-Laser-Crystallization method, Jpn. J. Appl. Phys. vol. 40 (2001), pp. 3049-3054.
Chang-Ho et al., A Novel Phase-Modulated Excimer-Laser Crystallization Method of Silicon Think Films, Jpn. J. Appl. Phys. vol. 37 (1998) pp. L492-L495.
International Search Report Sep. 24, 2004.

* cited by examiner

*Primary Examiner*—S. Rosasco
(74) *Attorney, Agent, or Firm*—Oblon, Spivak, McClelland, Maier & Neustadt, P.C.

(57) ABSTRACT

A phase shift mask is arranged before a laser device through a beam expander, a homogenizer and a mirror, and a processed substrate is set on an opposed surface of the phase shift mask with an image forming optical system therebetween. The processed substrate is held at a predetermined position by using a substrate chuck such as a vacuum chuck or an electrostatic chuck.

15 Claims, 8 Drawing Sheets

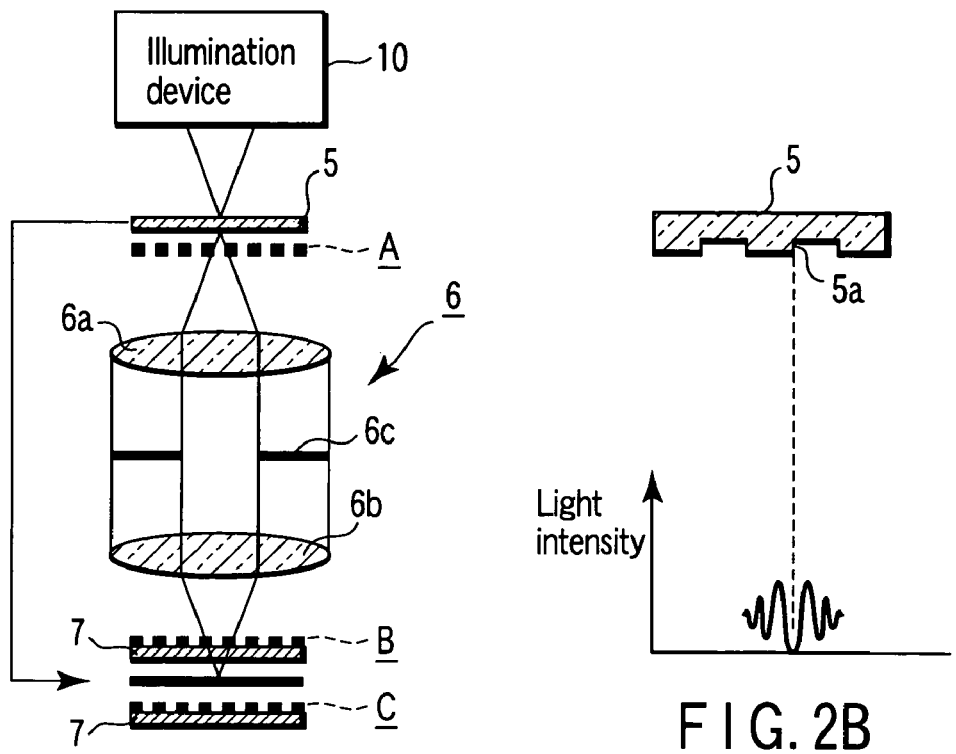
FIG. 2A
FIG. 2B
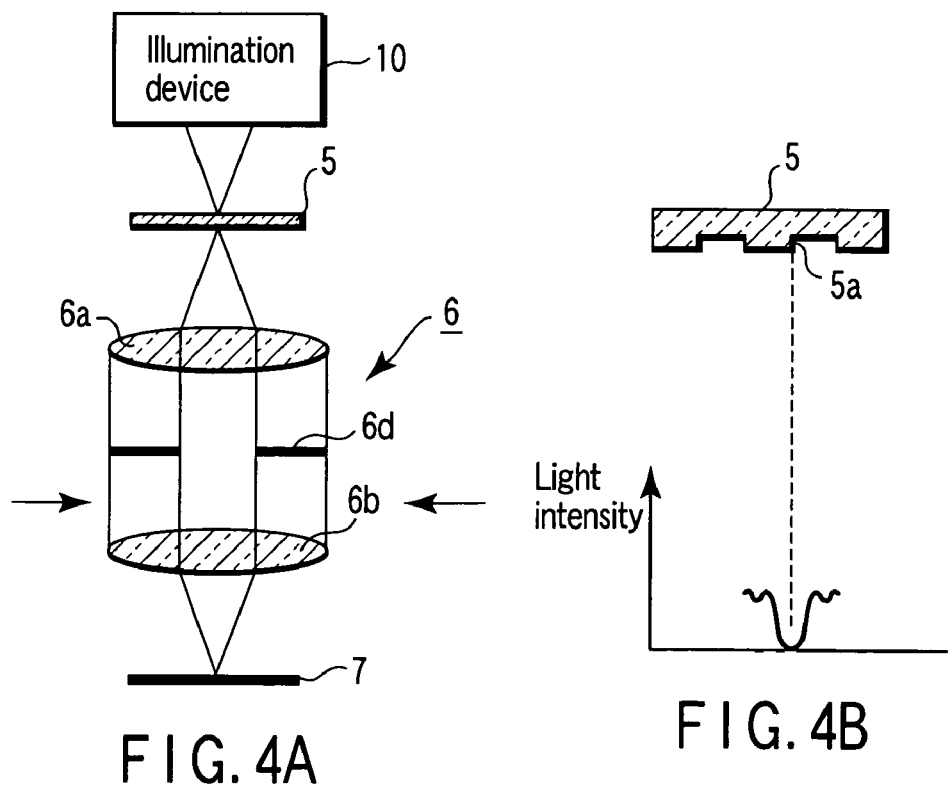
FIG. 4A
FIG. 4B

5e : Phase 0
5f : Phase $\pi/2$
5g : Phase $\pi$
5h : Phase $3\pi/2$

CRYSTALLIZATION APPARATUS, CRYSTALLIZATION METHOD, AND PHASE SHIFT MASK

CROSS-REFERENCE TO RELATED APPLICATIONS

This is a Continuation Application of PCT Application No. PCT/JP03/03366, filed Mar. 19, 2003, which was not published under PCT Article 21(2) in English.

This application is based upon and claims the benefit of priority from the prior Japanese Patent Application No. 2002-120312, filed Apr. 23, 2002, the entire contents of which are incorporated herein by reference.

BACKGROUND OF THE INVENTION

1. Field of the Invention

The present invention relates to a film (more particularly, a material constituting a film) crystallization apparatus and method, and a phase shift mask. The apparatus and method generate a crystallized film, e.g., a polycrystal or monocrystal film (semiconductor film), by irradiating a film to be subjected to crystallization processing, e.g., a polycrystal or amorphous film (e.g., a semiconductor film), with light rays having their phase modulated by using a phase shift mask, i.e., a phase shifter.

2. Description of the Related Art

In a liquid crystal display (LCD), there is known a switching element which controls a voltage applied to pixels of the LCD or a thin film transistor (TFT) as a semiconductor element which is used in a driver circuit driving the switching elements. As materials of a primary part of the transistors, there are roughly known amorphous silicon (a-Si), polycrystal silicon (poly-Si) and single crystal silicon (single-Si).

Since the electron mobility of the single-Si is higher than that of the poly-Si and the electron mobility of the poly-Si is higher than that of the a-Si, the single-Si and the poly-Si have a high switching speed when applied to the transistors and there are advantages, e.g., an increase in response of the display, a reduction in a design margin of any other component and the like.

When peripheral circuits such as a driver circuit or a DAC incorporated in the display are constituted by the transistors, these circuits can be operated at higher speed.

Although the poly-Si is composed of an aggregate of crystal grains, its mobility is lower than that of the monocrystal silicon, and it has a problem in irregularities of a grain boundary number which enters a channel when a transistor is reduced in size.

Therefore, there have been recently proposed various kinds of methods which generate polycrystal silicon or, more preferably single crystal silicon with a large particle size.

As one of such methods, there is known "phase control ELA (excimer laser annealing)" by which a film to be crystallized is irradiated with a pulse laser beam through a phase shift mask with the phase shift mask being set parallel to the semiconductor film. This technique is described in detail in "Surface Science Vol. 21, No. 5, pp. 278–287, 2000" incorporated herein as a reference. Further, a similar technique is also disclosed in Japanese patent application No. 2000-306859 (laid open in Nov. 2, 2000).

This phase control ELA is a method by which an inverse peak pattern that a light intensity becomes minimum, e.g., substantially zero at a phase shift portion, i.e., a shift boundary is generated by alternately shifting a phase of the light ray passing through a mask pattern of the phase shift mask by 0 and π, a minimum intensity position of the inverse peak pattern is set to an area (crystal nucleus) which is solidified first, and the crystal is grown from that position in the lateral direction (lateral growth), thereby providing the crystal nucleus with a large particle size at a specified position. Here, the inverse peak pattern means one inverse chevron type intensity pattern such as that a minimum intensity is positioned at a peak of the minimum intensity and the intensity is gradually increased with distance from this peak. An intensity pattern that this inverse peak pattern is continuously or discontinuously positioned is referred to as an inverse peak waveform pattern in this specification.

A shape of the phase shift mask, a distance between this mask and a surface of a film to be crystallized (which will be referred to as a semiconductor surface for the convenience sake), an incident angle distribution of a laser beam to the semiconductor film are set in such a manner that an ideal light intensity profile can be obtained on the surface of the film.

This phase control ELA must hold the phase shift mask so as to be close to the semiconductor surface as much as possible or, typically it must be held with a gap of approximately several μm to several hundred μm in order to obtain the light intensity profile corresponding to the phase shift mask. If the both members are close to each other in this manner, a part of the semiconductor film is ablated and shattered due to irradiation of the laser, thereby contaminating the phase shift mask.

Therefore, there is a problem that the light intensity pattern is degraded with a use and crystallization does not correctly advance.

In order to attain accurate irradiation, a position of the semiconductor surface must be adjusted in an optical axis direction with respect to the phase shift mask. Since a gap between the phase shift mask and a semiconductor substrate is very small, there is also a problem that a sensor system for the positional adjustment or a light flux used for detection cannot be inserted.

BRIEF SUMMARY OF THE INVENTION

It is, therefore, an object of the present invention to provide a technique by which contamination due to ablation when irradiating a processed substrate with light rays, e.g., a laser beam through a mask such as a phase shift mask can be avoided and a predetermined member, e.g., a sensor for positioning the phase shift mask can be inserted between the phase shift mask and the processed mask.

In order to achieve this aim, according to a first aspect of the present invention, there is provided a crystallization apparatus comprising:

a light source which emits a light beam;

a mask which receives a light beam from this light source and makes an intensity distribution of this light beam into an inverse peak pattern that a peak value is a minimum intensity; and an image forming optical system which is positioned between the mask and a processed substrate, image-forms a light beam having the inverse peak pattern onto the processed substrate and crystallizes at least a part of a material of the processed substrate.

According to a second aspect of the present invention, there is provided a crystallization method comprising:

generating an inverse peak pattern having a peak value that a light intensity becomes substantially zero at a phase shift portion of a phase shift mask by using this mask; and crystallizing at least a part of a material of a processed substrate by irradiating the substrate with a light beam having the inverse peak pattern, wherein an image of a light beam of the phase shift mask is formed onto the processed substrate by an image forming optical system provided between the phase shift mask and the processed substrate.

According to a third embodiment of the present invention, there is provided a phase shift mask using a laser beam as a light beam, wherein a mask pattern has an intersection consisting of at least three or more phase shift lines, and an integral value of a complex transmittance of a circular area with this intersection at the center is substantially zero.

BRIEF DESCRIPTION OF THE SEVERAL VIEWS OF THE DRAWING

FIG. 2A is a view schematically showing an example that a coupling optical system of the apparatus depicted in FIG. 1 is configured in accordance with a defocus method, and FIG. 2B is a view schematically showing a relationship between a phase shift mask of this apparatus and an intensity pattern on a semiconductor surface;

FIG. 4A is a view schematically showing an example that the coupling optical system of the apparatus depicted in FIG. 1 is configured in accordance with an NA method, and FIG. 4B is a view schematically showing a relationship between a phase shift mask of this apparatus and an intensity pattern on the semiconductor surface;

DETAILED DESCRIPTION OF THE INVENTION

An embodiment according to the present invention will now be described hereinafter with reference to the accompanying drawings.

Figure 1:
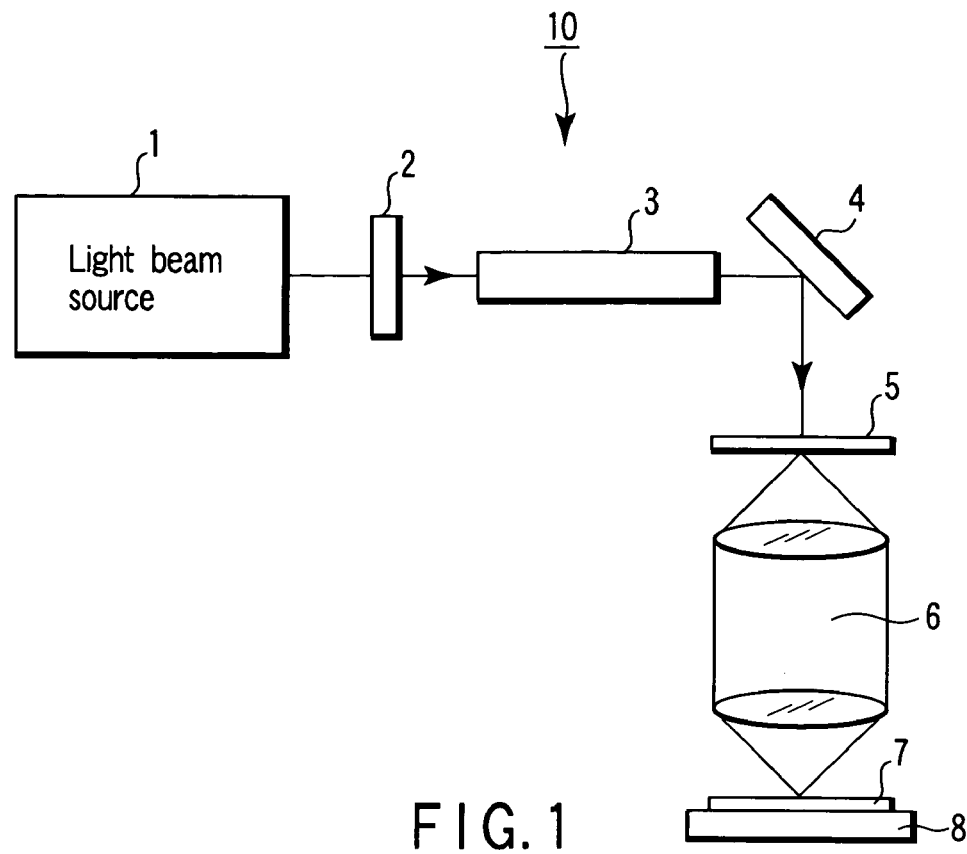
FIG. 1 is a view schematically showing a crystallization method and an entire embodied apparatus according to an embodiment of the present invention.

FIG. 1 is a schematic view showing a crystallized semiconductor film manufacturing apparatus as an embodiment of a film crystallization apparatus according to the present invention.

This apparatus has an excimer light beam source 1 and a laser irradiation device 10 which is constituted of a beam expander 2, a homogenizer 3 and a mirror 4 which are sequentially arranged on an oscillation side of this apparatus. This irradiation device may be a light source which emits light rays other than a laser beam. A laser beam emitted from the laser beam source 1 is expanded to a predetermined diameter by the beam expander 2, then its light intensity is homogenized by the homogenizer 3, and a phase shift mask 5 is irradiated with this beam. The phase shift mask 5, an image forming optical system 6 and a substrate support 8 are sequentially arranged on a laser beam outgoing radiation side of this laser irradiation device 10. This substrate support 8 is constituted of, e.g., a vacuum chuck or an electrostatic chuck which can support a processed substrate thereon. The term "processed substrate" in this invention means a substrate consisting of a material which is crystallized or a substrate in which a film or a layer having a material to be crystallized is formed on the support. In the present invention, the term "material to be crystallized" means a material whose structure substantially or actually becomes a crystal when irradiated with the laser beam. For example, in the case of a material having an amorphous structure, this terms means a material which becomes polycrystal or single crystal. Further, in the case of polycrystal, it means a material in which polycrystal is substantially or actually converted into monocrystal. Although an example of this material is amorphous silicon or polysilicon, any other material can be used. The support is, e.g., a glass or synthetic resin substrate in the field of a liquid crystal display and, for example, a silicon substrate is preferable in the field of a semiconductor. Although the shape of this substrate is not particularly restricted, the substrate has a rectangular shape for the purpose of manufacturing a liquid crystal display in this embodiment. In this embodiment, a description will be given as to a case that an amorphous silicon film formed on a glass substrate is converted into polycrystal or single crystal, but it can be readily understood that the present invention is not restricted thereto.

The substrate support 8 is arranged so as to maintain an irradiation surface of the processed substrate 7, i.e., an incident surface in parallel with the phase shift mask 5 with a high accuracy, and it is preferably attached on a predetermined drive mechanism (not shown) such as a triaxial table so as to selectively move the processed substrate 7 with respect to the phase shift mask 5 in three directions orthogonal to each other, i.e., directions X (longitudinal direction of the substrate), Y (widthwise direction of the substrate) and Z (vertical direction of the substrate, i.e., a direction along an optical axis of the image forming optical system).

As will be described later, the image forming optical system is not restricted to a type as long as it can image-form a mask pattern of the phase shift mask onto the irradiation surface (incident surface) of the processed substrate. For example, a single image forming lens may be simply used, but an optical system which forms an image of a pattern based on a defocus method, an NA (numeral aperture) method and a pupil function method mentioned below is preferable.

An example of the image forming optical system utilizing the defocus method will now be described hereinafter with reference to FIGS. 2A and 2B.

The defocus method is a method by which the image forming optical system 6 with a sufficiently large numerical aperture (NA) is inserted between the phase shift mask 5 and the processed substrate 7, a processed surface of the processed substrate 7 is held at a position obtained by defocusing from a focal position of the image forming optical system 6 and a light intensity distribution is adjusted based on an incident angle distribution of illumination light rays, a mask pattern and a defocus quantity.

As shown in FIG. 2A, the image forming optical system 6 is constituted of a pair of image forming lenses arranged in parallel to each other with a predetermined gap therebetween, i.e., convex lenses 6a and 6b, and an aperture 6c which is arranged between these lenses and has a predetermined NA. In such an optical system, a light intensity distribution of an outgoing radiation side surface of the phase shift mask 5 is approximately uniform, a diffraction fringe is generated at an out-of-focus position of a phase shift portion in that case, and such a light intensity distribution (defocus image A) with a Becke's line as shown in the drawing can be obtained. An image of a mask pattern of the phase shift mask 5 is formed on an image forming surface by the image forming optical system 6. This image forming surface is positioned on a conjugate surface of the mask as indicated by an arrow in the drawing. In the light intensity distribution on this image forming surface, although components having a resolution which is not more than a resolution $R=k\lambda/NA$ determined based on NA of the image forming optical system 6 are cut, the intensity is basically uniform. In the light intensity distributions (defocus images B and C) at two positions distanced forward and backward from the image forming surface in the optical axis direction (away from the image forming surface by a distance substantially equal to a distance between the phase shift mask 5 and the defocus image A), components having a resolution which is not more than the resolution $R=k\lambda/NA$ determined based on NA of the image forming optical system 6 are cut, but the intensity basically becomes equal to that of the defocus image A. By arranging the processed surface of the processed substrate 7 at one of these two positions and irradiating it with the light, as shown in FIG. 2B, like the phase control ELA method, exposure is carried out by using an intensity waveform pattern having one or more inverse peak patterns that the intensity becomes the minimum intensity, e.g., 0 or substantially 0 at a position of the pattern on the processed surface corresponding to the phase shift portion, i.e., a phase shift boundary 5a.

A width of the inverse peak pattern at this time is increased in proportion to 1/square of a defocus quantity.

For example, in the image forming optical system 6, an entire length (distance between an object surface and an image surface) is 1000 mm, a focal distance of each of the lenses 6a and 6b is 250 mm, and a numerical aperture (NA) of the aperture 6c is 0.2. The light source 1 of the laser illumination device 10 is a KrF excimer laser beam source which radiates in the form pulses a laser beam having a central wavelength being 248.55 nm and a full width at half maximum of an oscillation wavelength distribution being 0.3 nm.

The phase shift mask 5 is irradiated with the laser beam from the illumination device 10, and an image of the mask pattern is formed on the processed substrate. As a result, a material to be crystallized which is an amorphous silicon film in this case is subjected to a heat treatment and crystallized into polysilicon and/or single crystal silicon. At the time of crystallization, by shifting the processed substrate in a direction X and/or Y, a predetermined area or an entire area of the film can be crystallized. At this time, although ablation is generated from the processed substrate 7, since the image forming optical system 6 is positioned between the phase shift mask 5 and the substrate 7, the phase shift mask 5 is not contaminated. Although there is a possibility that the lens 6b of the image forming optical system 6 which directly faces the substrate 7 may be contaminated at this time, since a distance (approximately 250 mm in this example) between the lens 6b and the processed substrate 7 is considerably greater than a distance (several μm to several-hundred μm) between the phase shift mask and the processed substrate in the prior art, the optical system is rarely contaminated.

Figure 3:
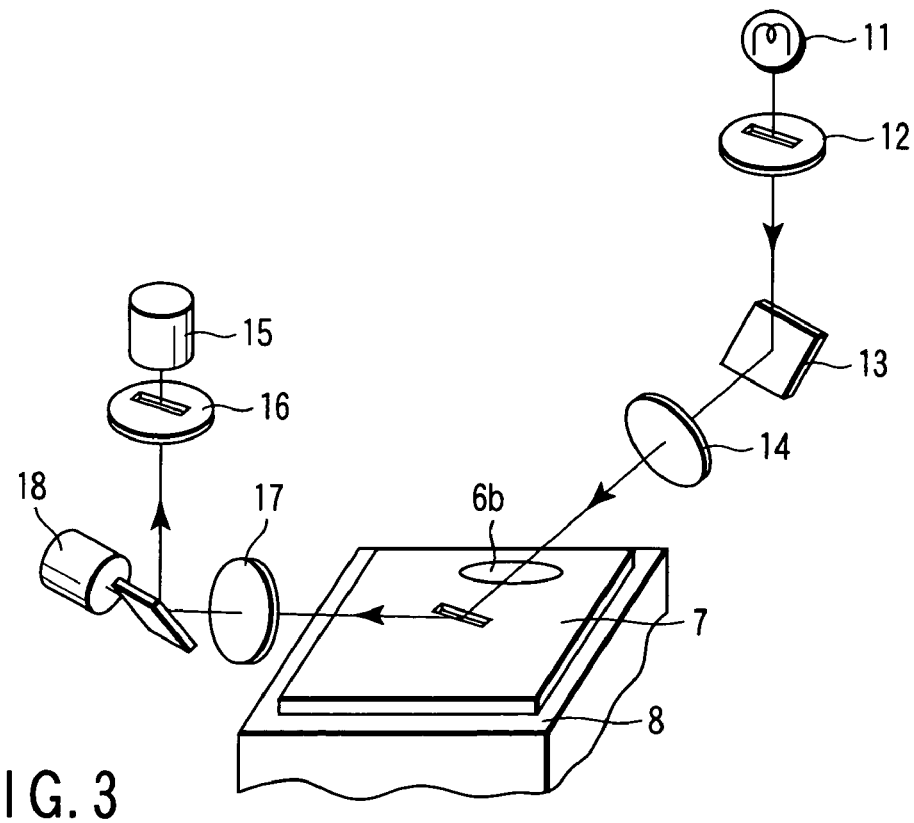
FIG. 3 is a view schematically showing an example of a structure of a positioning device for a processed substrate.

In FIG. 2A, a device used for positioning of the processed substrate 7 to a position B or C (positioning in a direction Z) is eliminated. For example, when such an automatic focusing device as shown in FIG. 3 is arranged as a positioning device between the phase shift mask 5 and the processed substrate 7 or arranged outside the both members, an inspection beam can be set so as to pass between the both members. This positioning device is required in order to obtain an excellent device across the entire surface of the processed substrate. This device is constituted of a slit light projection optical system with the processed substrate positioned between itself and the device, and a slit light detection optical system. The projection optical system is constituted of a light source, e.g., a halogen lamp 11, an exposure slit 12 which forms light rays from this light source into slit light rays, a mirror 13 which deflects the slit light in a direction of the processed substrate, and a projection lens 14 used to image-form reflected light rays from this mirror as a slit image on the processed surface of the processed substrate. The inspection optical system is constituted of a detector 15 which detects a slit image reflected by the processed substrate, a light receiving slit 16 provided immediately before the detector, a condensing lens 17 which is subsequently provided between the light receiving slit and the detector and condenses a reflected slit image from the substrate onto the detector 15 through the light receiving slit 16, and a vibration mirror 18 capable of swiveling in such a manner that the light from the condensing lens passes through the light receiving slit. A position of the processed substrate in the direction Z can be adjusted by a non-illustrated drive mechanism by adjusting an angle position of the vibration mirror.

An example of the image forming optical system utilizing the NA method will now be described with reference to FIGS. 4A and 4B. In the following example, like reference numerals denote members which are substantially the same as those in the image forming optical system utilizing the defocus method, thereby eliminating the explanation.

The NA method is a method by which the processed substrate 7 is held at a focal position of the image forming optical system 6 and a light intensity distribution is adjusted based on an angle distribution of the illumination light, the mask pattern and NA, the image forming optical system 6 whose numerical aperture (NA) can be adjusted being arranged between the phase shift mask 5 and the processed substrate 7. In this optical system, in FIG. 4A, the mask pattern of the phase shift mask 5 is image-formed by the image forming optical system 6. An aperture 6*d* of the image forming optical system 6 capable of changing its aperture dimension, i.e., NA, or a plurality of apertures 6*d* having different NAs are prepared, and NA can be changed by replacing the apertures.

In this optical system, since components whose resolution is not more than the resolution R=kλ/NA determined based on NA are cut, an inverse peak pattern which has a light intensity becoming minimum, e.g., 0, and a width substantially the same as the resolution is generated in the phase shift portion 5*a* on such a focal surface as shown in FIG. 4B. In this example, k is a value which is substantially close to 1 although it varies depending on a specification of the optical system by which the mask is irradiated, a degree of coherence of the light source and a definition of the resolution.

By arranging the processed substrate on the focal surface and performing light irradiation, a crystal nucleus can be generated. A width of the inverse peak pattern at this time is determined in proportion to the resolution R=kλ/NA. That is, when NA is reduced and the resolution is intentionally lowered, a width of the inverse peak pattern is increased. At this time, a method of reducing NA is using the aperture having a reduced aperture dimension as described above.

When such a type of the image forming optical system is interposed between the phase shift mask and the processed substrate, the same advantages as those when utilizing the defocus method can be demonstrated.

Figure 5A:
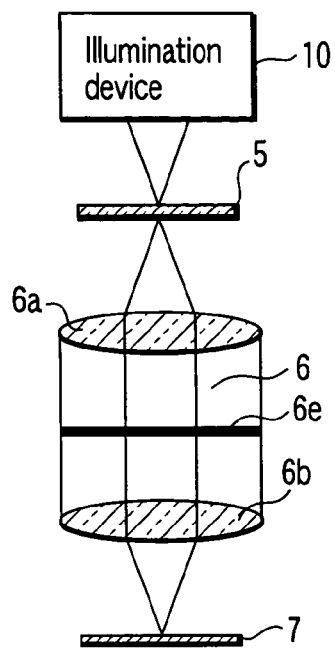
FIG. 5A is a view schematically showing an example that the coupling optical system of the apparatus depicted in FIG. 1 is configured in accordance with a pupil function method.

An image forming optical system utilizing a pupil function method will now be described with reference to FIGS. 5A and 5B.

The pupil function method is a method by which the image forming optical system 6 having such an aperture (i.e., a pupil) 6*e* as shown in the drawing is inserted between the phase shift mask 5 and the processed substrate 7, the processed substrate 7 is held at a focal position of the image forming optical system 6, and a light intensity distribution is adjusted based on an angle distribution of the illumination light, a mask pattern and a pupil function.

Figure 5B:
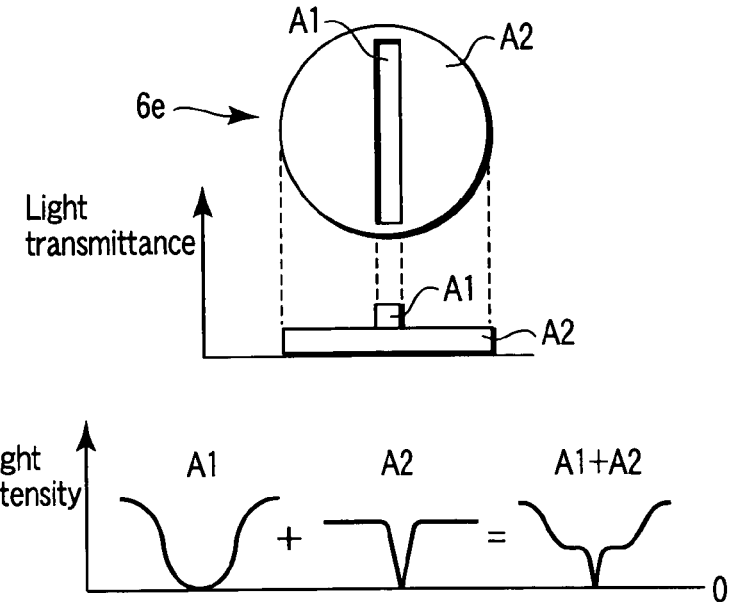
FIG. 5B is a view schematically showing a relationship between a pupil of this apparatus and an intensity pattern on the semiconductor surface.

As shown in FIG. 5B, the aperture 6*e* consists of a circular substrate and is constituted of a slit-shaped complete light transmission area A1 on the inner side and a light semi-transmission area A2 on the outer side. The light semi-transmission area A2 allows transmission of a part of the light and prevents transmission of the remaining light through the pupil by any method. A light transmittance of the light semi-transmission area A2 is selected in many ways in accordance with needs, and it is not necessarily restricted to 50%. A shape of the pupil and a shape of the light semi-transmission area are not likewise restricted the above shapes. For example, the light semi-transmission area A2 may have a circular or rectangular shape.

A first method for manufacturing the aperture 6*e* forms a film with a light shielding material such as chrome on the entire transparent plate of, e.g., glass, a synthetic resin and others into a thickness corresponding to a desired transmittance by sputtering or the like, then etches and removes only a part of the film corresponding to the light semi-transmission area, and exposes the transparent plate.

In this case, the light shielding material reflects a part of the light and absorbs a part of the light. A degree of this absorption (transmission) can be arbitrarily set based on a thickness of the film. The chrome film is just an example, and any material such as ZrSiO which prevents transmission of a part of the light can be used.

A second aperture manufacturing method forms a multilayer film, which is designed so as to partially reflect the light having a wavelength used to the light semi-transmission area A2, on the entire surface of the transparent plate, and then patterns and removes only a part of the film corresponding to the light transmission area A1. As described above, in case of the pupil which reflects a part of the light, since a material forming the aperture, i.e., a material forming the light semi-transmission area does not absorb unnecessary light rays, there is an advantage that the aperture does not generate heat. In this case, it is desirable to consider arrangement of any other component so as to prevent the reflected light from the aperture from reaching any other lens or lens barrel, which can be a factor of flare (stray light).

As described above, in case of the aperture 6*e* having the complete light transmission area Al and the light semi-transmission area A2, it is desirable to consider adjustment of a thickness, a material or the like in such a manner that a phase difference is not generated between the both areas A1 and A2.

In the above explanation of the aperture 6*e*, how the light semi-transmission area A2 is stipulated is eliminated. This stipulating means can be achieved by, e.g., forming a part positioned around an aperture of a member supporting the aperture 6*e* with a light shielding material, and reflecting or absorbing the light passing through the outer side of the aperture. Alternatively, a light shielding preventing area surrounding the light semi-transmission area may be formed at a part close to the outer side of the aperture 6*e*.

The pupil function method generally utilizes a fact that a spot diameter of image formation is reduced if NA of the pupil is large, and apparent NA of the light which has passed through the complete light transmission area A1 is decreased. Therefore, an inverse peak pattern with a wide width such as indicated by reference symbol A1 in FIG. 5B is generated (light semi-transmission area A2 is also measured as the light transmission preventing area). Since apparent NA of the light which has passed through the light semi-transmission area A2 is increased, an inverse peak pattern with a narrow width such as indicated by a reference symbol A2 in FIG. 5B is generated (light transmission area is also measured as the light semi-transmission area). As a result, by determining the pupil function of the image forming optical system 6 as a sum of functions of the complete light transmission area A1 and the light semi-transmission area A2, there is generated a two-stage inverse peak pattern having a first pattern which includes a peak value that a light intensity becomes 0 in such a phase shift part on the focal surface as shown in the drawing and which is positioned on a side where the intensity is low, a second pattern which is positioned on a side there the intensity is high, and a step portion positioned between the first pattern and the second pattern in such a manner that a width of the first pattern becomes much larger than that of the second pattern.

In this pupil function method, although the inverse peak pattern generation principle is similar to the NA method, the NA method controls only a size of the pattern whereas the pupil function method can also control a shape of the pattern.

When the processed substrate 7 is arranged on this focal plane and the light irradiation is performed, since the light intensity has the minimum intensity of substantially zero in the inner, i.e., first pattern, this point becomes a crystal nucleus. In the outer, i.e., the second pattern, since a temperature gradient according to the light intensity distribution is generated, the crystal growth in the lateral direction is facilitated as compared with a case of the simple inverse peak pattern shown in FIG. 4B.

Both the complete light transmission area A1 and the light semi-transmission area A2 may have a circular shape. However, by changing the length of each area depending on the directions X and Y like an ellipse, the light intensity distribution of the two-stage inverse peak pattern can be changed depending on the direction X and the direction Y.

Assuming that D1 is a diameter of the inner, i.e., first pattern of the two-stage inverse peak pattern, D2 is a diameter of the outer, i.e., the second pattern, θ1 is a diameter of the light semi-transmission area A2 represented by an angle, and θ2 is a diameter of the complete light transmission area A1, the following calculations can be achieved.

$$D1 = k\lambda/\sin\theta1$$

$$D2 = k\lambda/\sin\theta2$$

In this example, k is a value substantially close to 1 although it depends on a specification of the optical system which irradiates the mask, a degree of coherence of the light source and a definition of the resolution. As a result, the inner diameter D1 and the outer diameter D2 of the two-stage peak pattern are in inverse proportion to sizes of the light semi-transmission area A2 and the complete light transmission area A1, respectively.

Figure 6A:
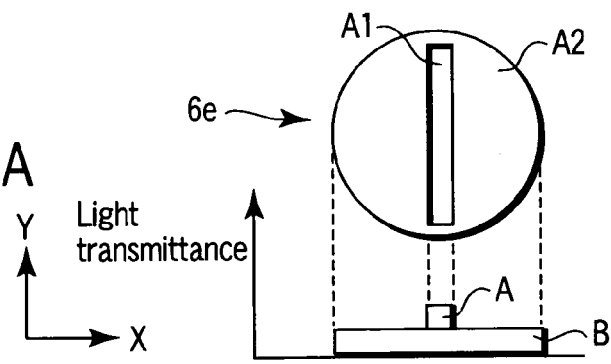
FIG. 6A is a view schematically showing a relationship between the pupil depicted in FIG. 4B and a waveform pattern.
Figure 6B:
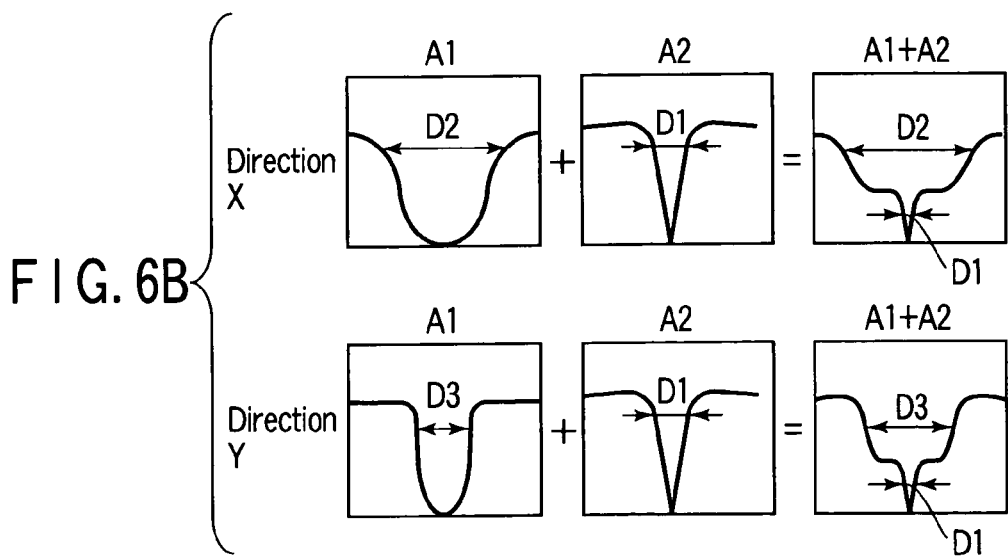
FIG. 6B is a view schematically showing waveform patterns formed by a semitransparent area and a transparent area of the pupil, respectively.
Figure 7:
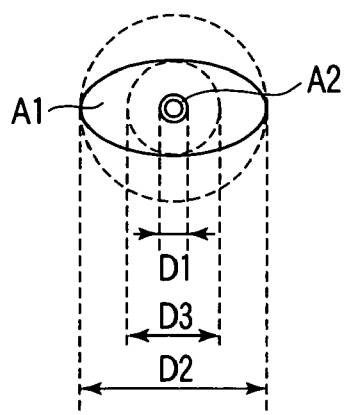
FIG. 7 is a plane view showing a two-stage peak pattern which is obtained by using the pupil depicted in FIG. 6A and has a light intensity distribution which differs depending on X and Y directions.

Therefore, as shown in FIG. 6A, since the complete light transmission area A1 has a rectangular shape which is short in the direction X and long in the direction Y, the light intensity distribution of its inverse peak pattern has a large width in the direction X (indicated by D2) and a small width in the direction Y (indicated by D3), as indicated by A1 in FIG. 6B. On the other hand, since the light semi-transmission area A2 has a circular shape, the light intensity distribution of its inverse peak pattern has the same small widths in both the direction X and the direction Y (indicated by D1) as indicated by A2 in FIG. 6B. Therefore, as indicated by A1+A2 in FIG. 6B, the light intensity distribution of the two-stage inverse peak pattern which is a sum of the both inverse peak patterns has a width in the direction X (D2) greater than a width D3 in the direction Y in the outer, i.e., the second pattern, and has the same small widths in the direction X and the direction Y (D1) in the inner, i.e., the first pattern. FIG. 7 is a plane view showing a relationship between the two-stage inverse peak pattern and the pupil in this manner. As apparent from FIG. 7, the second pattern corresponding to the light transmission area A1 has an elliptic cross section (D2 denotes a major axis, D3 designates a minor axis), and a cross section of the first pattern corresponding to the light semi-transmission area A2 has a circular shape (D1 denotes a diameter). Since the width in the direction X and the width in the direction Y of the second pattern of such a two-stage inverse peak pattern are set based on a length in the direction X and a length in the direction Y of the light transmission area A1, a shape of a crystal to be crystallized and a pitch of its arrangement can be controlled so as to differ depending on the directions X and Y.

In particular, a fact that axes of the outer inverse peak pattern (second pattern) differ depending on the directions X and Y means that inclinations in change of positions-intensities differ in the intensity distribution on the substrate, the crystal selectively grows in a direction with the large inclination, i.e., the direction of the minor axis of the outer inverse peak pattern, and the resultant crystal has the high electron mobility in that direction. By setting directions of a source and a drain of the transistor to this direction, a transistor with excellent characteristics can be manufactured.

Since the pupil function method can generate the two-stage inverse peak pattern in this manner although it has the characteristics of the NA method, it is further effective for crystallization.

The illumination optical system in the embodiment according to the present invention combines the excimer laser with the optical system and emits the illumination light from the laser with which the phase shift mask is irradiated. At this time, it is desirable to assure the homogeneity of the light intensity in the phase shift mask plane and the homogeneity in the incident angle direction. In particular, since the excimer laser has irregularities in oscillation position in accordance with each pulse, assuring the homogeneities is desirable in order to perform uniform crystallization.

At the same time, in order not to reduce the contrast of a defocus image of the phase shift mask (not to raise the center intensity of the inverse peak pattern), it is desirable for the defocus method to have less diffusions (close to a parallel light ray). Furthermore, in order to obtain a necessary resolution, assuring NA which is not less than a given value and suppressing an aberration quantity of the optical system are preferable.

In the NA method, as different from the defocus method, reducing diffusions (close to a parallel light ray) is not desired. Moreover, in order to intentionally remove components having a resolution not less than a predetermined value, it is desirable to provide an adjustment mechanism used to set NA to a predetermined value.

A description will now be given as to a concrete example of the image forming optical system utilizing the defocus method mentioned in connection with FIGS. 2A and 2B.

In this concrete example, the laser device 1 was constituted of a KrF excimer laser having a wavelength of 248 nm, a light flux of a laser beam was expanded by the beam expander 2, and the light intensity with which the phase shift mask 5 is irradiated was homogenized by the homogenizer 3.

The homogenizer 3 was realized by a fly-eye lens which is similar to one used in a general exposure. NA of this illumination device 10 was determined to be 0.05.

As the image forming optical system 6, a two-side telecentric system that both an incident pupil and an outgoing radiation pupil are positioned at infinity was used. As its basic specification, NA was determined to be 0.2 and a magnification was determined to be 1.0.

The phase shift mask 5 will now be described hereinafter with reference to FIG. 8.

As described in the above known example, adjacent areas having different thicknesses are provided to a transparent medium, e.g., a quartz substrate, and the phase shift mask diffracts and interferes a laser beam entering a boundary of steps (phase shift portions) between these areas, and gives a cyclic spatial distribution to the intensity of the entered laser beam. FIG. 8 shows an example of such a phase shift mask. This phase shift mask 5 has a first strip area (phase area) 5b that alternately arranged phases are π and a second strip area (phase area) 5c that phases are 0 in such a manner that adjacent patterns are in anti-phase (shifting of 180°). These strip areas (phase shift line area) has a width of 10 μm. Specifically, the phase shift mask 5 was manufactured by patterning and etching a rectangular quartz substrate having a refractive index of 1.5 to a depth that the phase corresponds to π with respect to the light of 248 nm, i.e., a depth of 248 nm. An area formed thin by this etching is the first strip area 5b, and an area which is not etched is the second strip area 5c.

Figure 10:
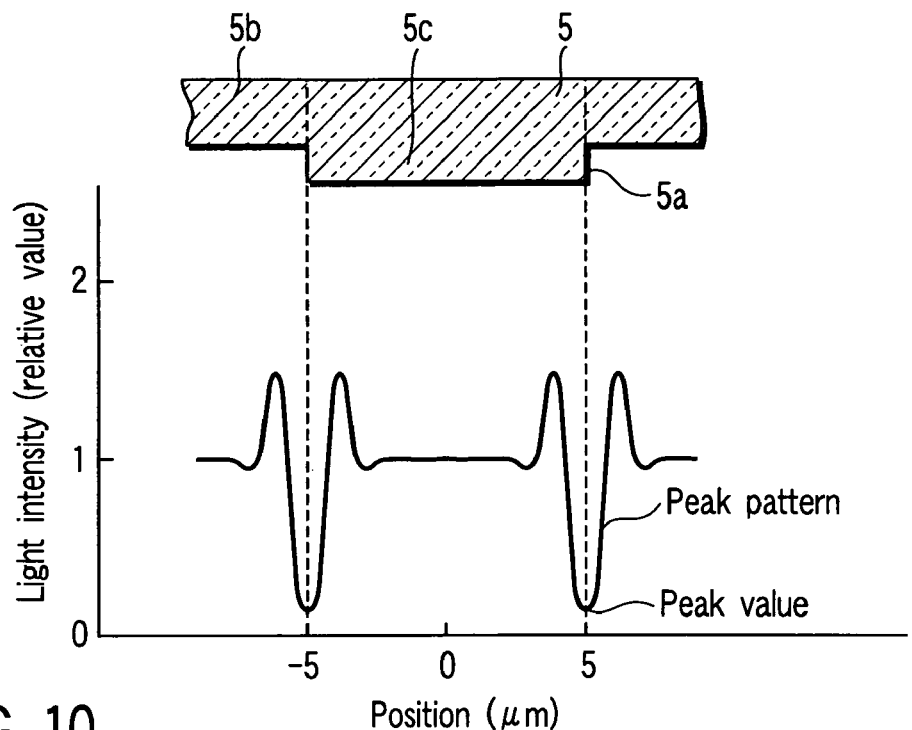
FIG. 10 is a light intensity distribution graph based on the defocus method according to the present invention.

In the phase shift mask 5 having such a structure, the laser beam which has passed through the thick second phase area 5c is delayed 180° as compared with the laser beam which has passed through the thin first phase area 5b. As a result, interference and diffraction occur between the laser beams, and an intensity distribution which is substantially the same as the intensity distribution of the laser beam such as shown in FIG. 10 can be obtained. That is, since the adjacent transmission light beams which have passed through the phase shift portion are in anti-phase, the light intensity becomes minimum, e.g., zero at a position corresponding to a point between these areas. The area where the light intensity is minimum or an area in the vicinity of this former area becomes a nucleus when crystallizing the semiconductor.

Generally, assuming that λ is a wavelength of the laser beam, a thickness t of a transparent medium having a refractive index n for giving a phase difference of 180° to the transparent medium (difference between the thick area and the thin area) is represented by the following expression.

$$t=\lambda/2(n-1)$$

A concrete example of crystallization will now be described hereinafter.

As the processed substrate 7, there was used one obtained by forming an underlying film and an a-Si film on a liquid crystal display glass plate having a thickness of 0.6 mm in the mentioned order by a chemical vapor deposition method.

With the above-described structure, the processed substrate 7 was set at a defocus position distanced downwards from a focal position of the image forming optical system 6 by 10 μm, and pulse irradiation was carried out in such a manner that a light energy (capacity of an energy which instantaneously fuses a laser beam irradiated portion of the a-Si film) on the a-Si film surface becomes approximately 100 mJ/cm$^2$.

FIG. 10 shows a light intensity distribution obtained by a calculation under the above-described condition. In this drawing, it can be understood that there is formed an intensity waveform pattern that an inverse phase pattern that a part corresponding to the phase shift portion 5a of the phase shift mask 5 has a minimum intensity is formed in accordance with the vicinity of the phase shift portion. A distance between the respective inverse phase patterns is 10 μm in accordance with widths of the strip areas 5b and 5c. As a result, when the amorphous silicon film was irradiated with the laser beam while relatively moving the processed substrate with respect to the phase shift mask 5 in a direction orthogonal to the page space of FIG. 10, there was obtained a polycrystal poly-Si film having a large particle size that a crystal particle position is controlled with a pitch 10 μm in both directions X and Y.

A concrete example using the image forming device utilizing the NA method will now be described. Basically, a light source and an optical system similar to those in the above concrete example were used. In this concrete example, however, there was prepared a mechanism which can adjust NA of the image forming optical system by replacing an aperture (circular opening) of the image forming optical system. NA of the image forming optical diameter was adjusted to 0.1 by using this mechanism, NA of the illumination system was set to 0.05, the processed substrate 7 similar to that in the above concrete example was set at a focal position of the image forming optical system 6, and pulse irradiation was carried out in such a manner that the light energy becomes approximately 100 mJ/cm$^2$ on the a-Si film surface.

Figure 11:
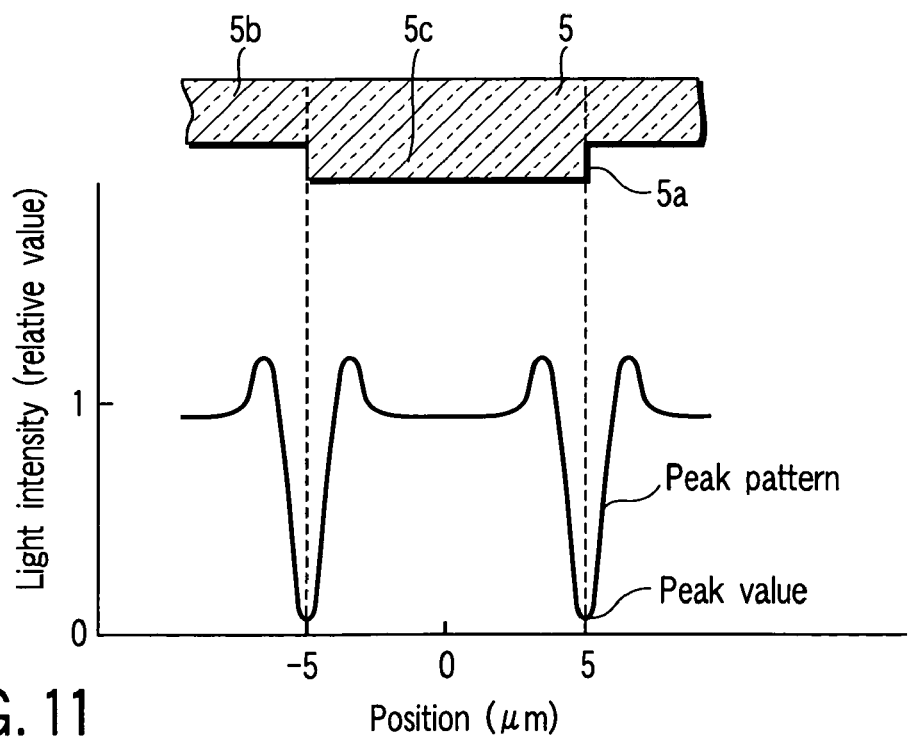
FIG. 11 is a light intensity distribution graph based on the NA method according to the present invention.

FIG. 11 shows a light intensity distribution obtained by a calculation under this condition. It can be understood that irradiation with the same intensity waveform pattern as that in the above concrete example is performed even if this device was used. In this example, there was likewise obtained a polycrystal poly-Si film having a large particle size that a crystal grain position is controlled with a patch 10 μm in both the directions X and Y.

Figure 8:
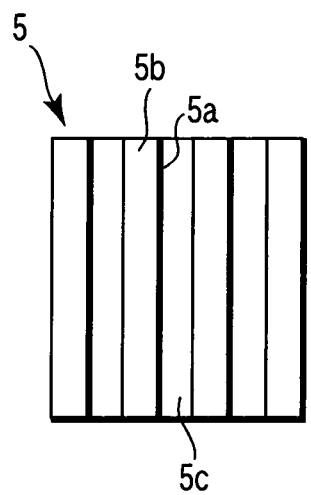
FIG. 8 is a plane view schematically showing an example of a phase shift mask in which phase shift areas are arranged in lines.

In the above concrete example, although the phase shift mask 5 that the phase shift portions are a plurality of straight lines parallel to each other as shown in FIG. 8 was used, the present invention is not restricted thereto.

For example, the phase shift lines can be set orthogonal to each other, and the phases 0 and π can be arranged in the lattice form. In this case, a lattice area having a light intensity of zero is produced along the phase shift lines. Therefore, since the crystal nucleus is generated at an arbitrary position on this line, there is a problem that the control over a position/shape of the crystal grain is difficult. Thus, in order to control occurrence of the crystal nucleus, it is desirable that the area having the intensity of zero is a dot. Accordingly, the intensity does not completely become zero at a corresponding position of the phase shift lines (although it is decreased) by setting phase shift quantities of the phase shift lines orthogonal to each other to be less than 180° and, at the same time, the intensity at a position corresponding to the intersection can be set to 0 by determining a sum of complex transmittances around the intersection as zero.

Figure 9A:
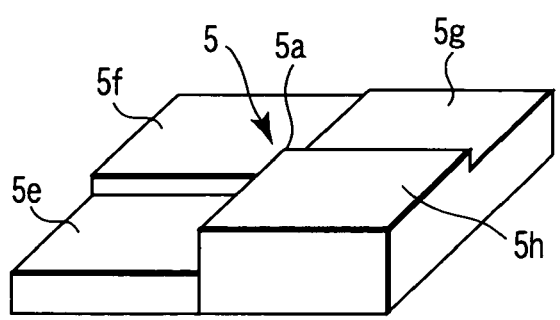
FIGS. 9A and 9B are a perspective view and a plane view showing an example of a phase shift mask in which phase shift areas area arranged in a lattice form.
Figure 9B:
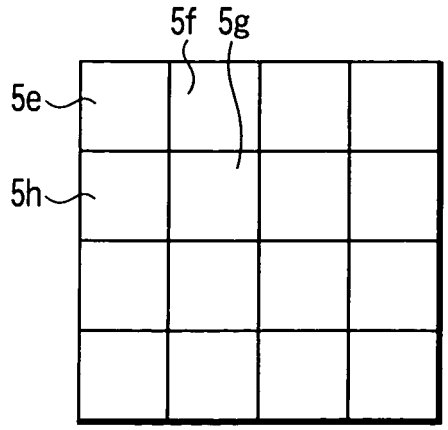

An example of this will now be described with reference to FIGS. 9A and 9B. As shown in FIG. 9A, this mask 5 has a plurality of sets each of which consists of a square pattern constituted of four square areas 5e, 5f, 5g and 5h having different thicknesses. In each set, as shown in FIG. 9B, the first area 5e has the smallest thickness and a phase of zero. The fourth area 5h has the largest thickness and its phase is shifted from that of the first area 5e by 3π/2. Phases of the second and third areas 5f and 5g whose thicknesses are between the thicknesses of the areas 5e and 5g are shifted from that of the first area by π/2 and π, respectively.

In such a mask, a part at which the first to fourth areas are adjacent to each other, e.g., a central point of the square pattern is an area where the intensity is zero. Therefore, since this point becomes a crystal nucleus, a position and a shape of a crystal grain can be readily controlled.

Although it is preferable that the mask pattern described in connection with FIGS. 8 and 9A is used in combination with the method utilizing the projection optical system according to the present invention, the present invention is not restricted to an application of this combination, and it can be likewise used in the conventional phase control ELA method. In this case, the intensity can be set to zero only on the phase shift line or at a point where these lines are orthogonal to each other, which is effective.

Although the phase shift portion of the phase shift mask has been described as a boundary line (FIG. 8) or a boundary point (FIGS. 9A and 9B) between the areas (phase areas) having different phases in the foregoing embodiment, this is a case that the phase area consists of only a translucent area, and the phase shift portion in the present invention is not restricted thereto and can be formed by slightly shifting from the boundary line or the boundary point. This will be described hereinafter.

In the defocus method, since a light intensity pattern (inverse peak pattern) generated at positions with predetermined gaps from a focal position of the image forming optical system (positions indicated by B and C in FIG. 2A) is utilized, "blurring" is generated due to gaps if an incident angle distribution of the illumination light is large. As a result, a gentle inverse chevron shape with a shallow inverse peak (intensity of an inverse peak value is considerably large) in the phase shift portion is obtained, irregularities in in-plane intensity of the laser beam from the beam source or irregularities in intensity for each oscillation pulse have an affect, and there is a possibility that even crystallization may not be achieved.

Figure 12:
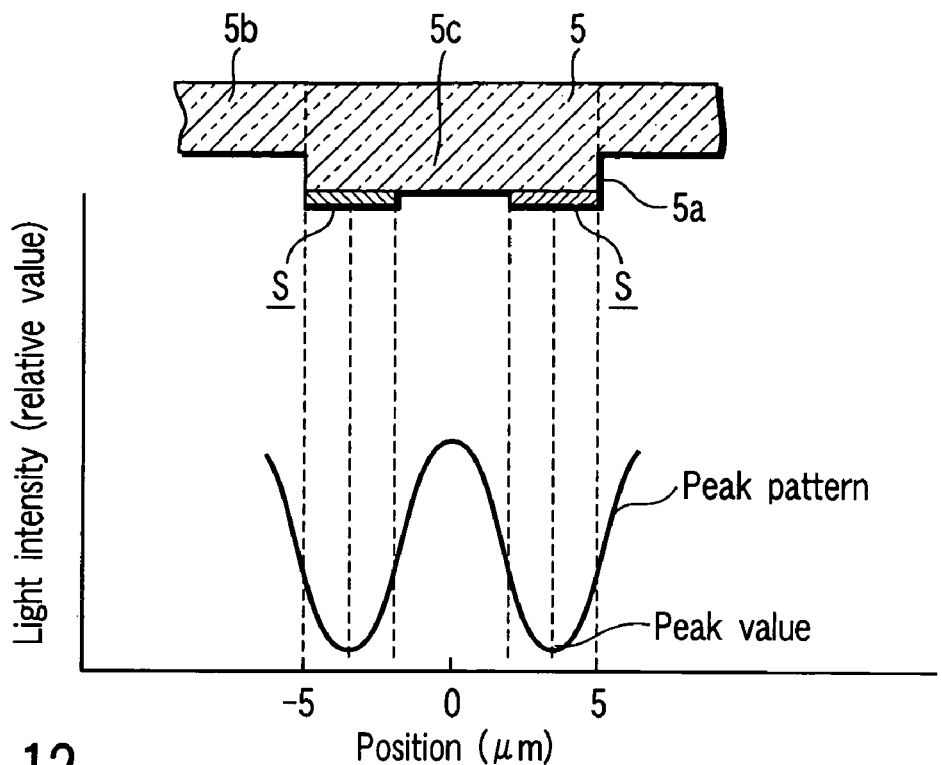
FIG. 12 is a view showing a modification of the phase shift mask.

In such a case, as shown in FIG. 12, this problem can be solved by providing a light shielding area with a small width to one phase area (second phase area in this embodiment) of the phase shift mask 5 along the boundary line. This reason will be described with reference to FIG. 13.

Figure 13:
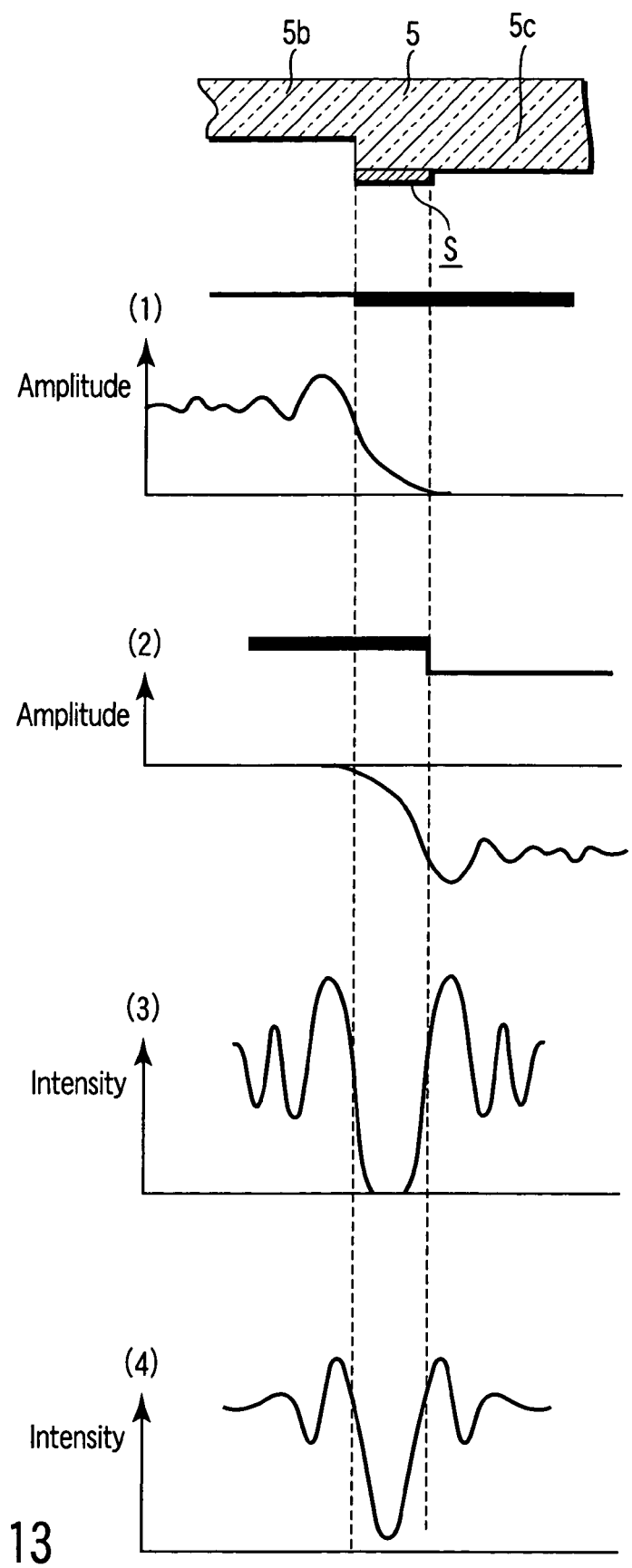
FIG. 13 is a view illustrating an effect of the phase shift mask depicted in FIG. 12.

When causing the parallel light to enter the phase shift mask 5, a light intensity distribution at the phase shift portion becomes ③ a light intensity distribution obtained by adding ① an amplitude of a diffraction fringe acquired from the first phase area 5b and ② an amplitude of a diffraction fringe acquired from the second phase area 5c and squaring its result. When the scattered light enters the phase shift mask, a final diffraction pattern is obtained by integrating a light intensity pattern acquired from the light rays at a plurality of different angles. Therefore, assuming that θ is an incident angle and Z is the gap, when performing integration taking a fact that shifting is performed by Z tan θ only in the plane into consideration, the light intensity pattern of the light based on the interference and the diffraction has gentle inverse chevron shapes with the boundary therebetween as described above if the light shielding area is not provided. If the light shielding area s is provided as shown in FIG. 12, however, there is obtained ② an amplitude of the diffraction fringe of the second phase area 5c such as shown in FIG. 13. As a result, ③ a light intensity distribution obtained by adding ① an amplitude of the diffraction fringe acquired from the first phase area 5b and ② an amplitude of the diffraction fringe acquired from the second phase area 5c and squaring its result is as shown in the drawing, and it can correspond to the light shielding area s by setting a width D of the light shielding area as follows, thereby obtaining the excellent inverse peak pattern having a peak value that the intensity is substantially zero.

When the scattered light enters the phase shift mask, since a shift quantity of the incident angle is Z tan θ at only a half angle of the incident angle, a pattern indicated by ④ mentioned above can be obtained if the width D of the light shielding area s satisfies $D \geq 2Z \tan \theta$.

A concrete example of the phase shift mask shown in FIG. 12 will now be described hereinafter.

A rectangular quartz substrate with a refractive index of 1.5 was etched to a depth that a phase corresponds to π with respect to the light having a wavelength of 248 nm, i.e., a depth of 248 nm, and a first phase area 5b and a second phase area 5c which is a non-etched area were formed. At this time, patterning was conducted in such a manner that a width of the first phase area 5b is 14 μm and a width of the second phase area 5c is 6 μm. Thereafter, a film of chrome was formed on one surface of the phase shift mask by sputtering, this was patterned, and the light shielding area s was formed on both sides of the second phase area along the boundary with the first phase area 5b. A width D of the light shielding area was determined to be 4 μm.

The thus formed phase shift mask 5 was used in the apparatus shown in FIG. 2A and crystallization was performed. At this time, the processed substrate 7 was placed at a position C distanced downwards from a focal position of the image forming optical system 6b by 20 μm (that is, Z=20 μm), and pulse irradiation was performed in such a manner that the light energy on the a-Si film surface of the processed substrate becomes approximately 100 mJ/cm². As a result, the amorphous silicon was able to be crystallized into polycrystal silicon with a large particle size that a crystal position is controlled.

Figure 14:
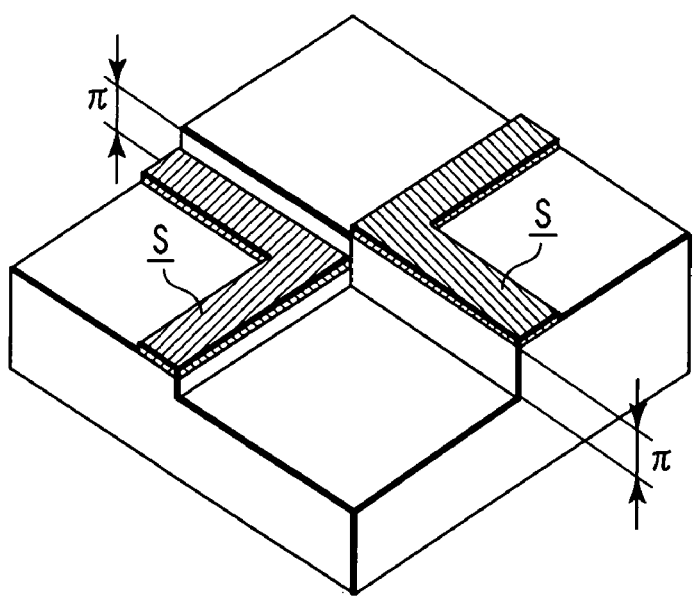
FIG. 14 is a perspective view partially showing another modification of the phase shift mask in which light shielding areas are formed.

The technique to provide the light shielding area s can be also applied to a phase shift mask of another conformation as shown in FIG. 14, for example. This example is an application to the mask shown in FIG. 9A, and the light shielding area s is provided in one phase area of the square phase areas along the boundary line of the adjacent phase areas. In this example, a sharp inverse peak pattern having a point-like peak value can be obtained at a position slightly shifted from an intersection of the four phase areas.

The light shielding area can be formed by using a film consisting of a material such as chrome which absorbs the light, and it can be also formed by using various kinds of techniques. For example, the light shielding area may be formed by using a multilayer film corresponding to a wavelength of an incident laser beam, or irregularities may be formed so that the incident light is scattered or diffracted.

The optical element constituting the image forming optical system is not restricted to the lens system, and it may be a mirror system. Further, it may be a composite system formed of a lens and a mirror.

A method for manufacturing an electronic device by using the manufacturing apparatus/method according to the present invention will now be described with reference to FIGS. 15A to 15E.

Figure 15A:
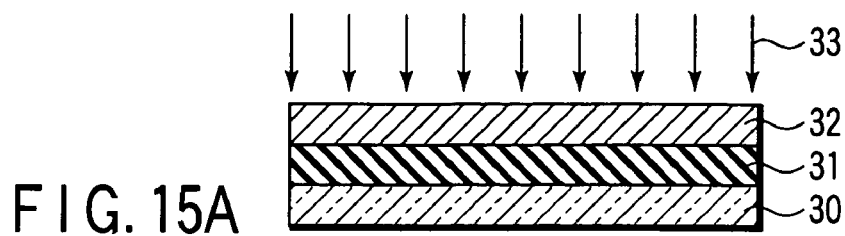
FIGS. 15A to 15E are views illustrating an example of a manufacturing method of an electronic device using the manufacturing apparatus/method according to the present invention.
Figure 15B:
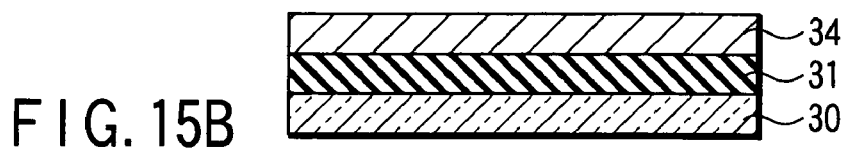
Figure 15C:
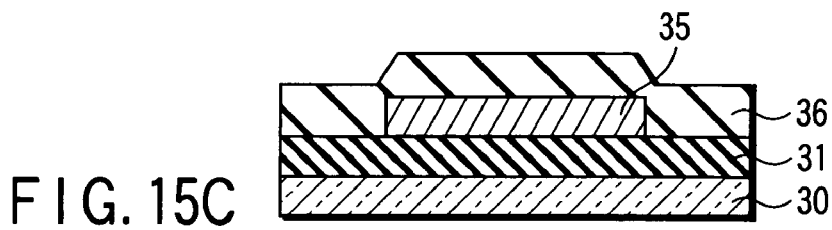

As shown in FIG. 15A, an underlying film 31 (e.g., a laminated film consisting of an SiN film having a film thickness of 50 nm and an SiO₂ film having a film thickness of 100 nm) and an amorphous semiconductor film 32 (e.g., Si, Ge, SiGe or the like having a film thickness of approximately 50 nm to 200 nm) are formed on an entire rectangular insulating substrate 30 (e.g., alkali glass, quartz glass, plastic, polyimide and others) by using a chemical vapor deposition method, a sputtering method or the like. Subsequently, a part or all of the surface of the amorphous semiconductor film 32 is irradiated with an excimer laser 33 (e.g., KrF or XeCl). Here, the apparatus and method described in the foregoing embodiment are used in the excimer laser beam irradiation. As a result, as shown in FIG. 15B, a material of the amorphous semiconductor film 32 is crystallized into a polycrystal semiconductor film 34. The thus formed polycrystal semiconductor film 34 is converted into a polycrystal or monocrystal semiconductor film with a large particle size whose crystal grain position is controlled as compared with a polycrystal semiconductor film using the conventional manufacturing apparatus.

Then, the monocrystal semiconductor film 34 is processed into an island-shaped semiconductor film 35 by using the photolithography, and the SiO₂ film having a film thickness of 20 nm to 100 nm is formed as a gate insulating film 36 on the underlying film 31 and the semiconductor film 35 by using the chemical vapor deposition method or the sputtering method.

Figure 15D:
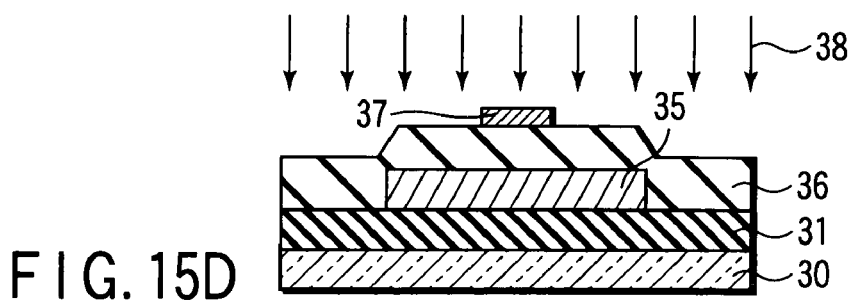

Subsequently, a gate electrode 37 (e.g., silicide or Mow) is formed at a position corresponding to the semiconductor film 35 on the gate film 36. With this gate electrode 37 being used as a mask, as shown in FIG. 15D, impurity ions 38 (phosphor in case of an N channel transistor, boron in case of a P channel transistor) are implanted into the semiconductor film 35, and this film is changed into an N type or a P type. Thereafter, the entire device is annealed in a nitrogen atmosphere (e.g., for one hour at 450° C.), impurities in the semiconductor film 35 are activated. As a result, the semiconductor film 35 becomes a source 41 with a high impurity concentration, a drain 42 and a channel area 40 with a low impurity concentration, which is positioned between the source 41 and the drain 42.

Figure 15E:
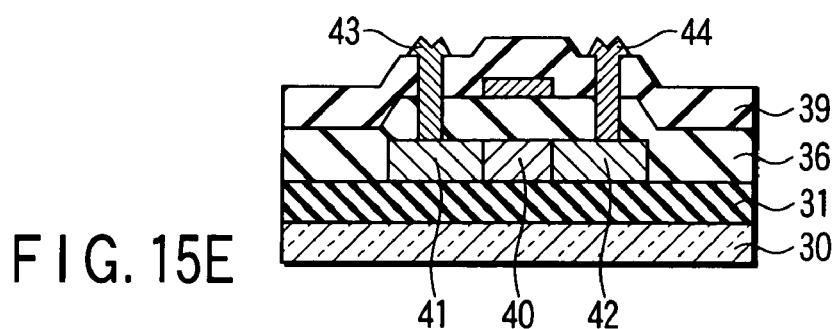

Then, an interlayer insulating film 39 is formed on the gate film 36. Subsequently, contract holes are formed to the gate film 36 of the interlayer insulating film 39 at positions corresponding to the source 41 and the drain 42. Thereafter, a source electrode 43 and a drain electrode 44 electrically connected to the source 41 and the drain 42 through the contact holes are formed on the interlayer insulating film 39 by using the film forming and patterning technique, as shown in FIG. 15E. It can be understood that the thus formed thin film transistor consists of polycrystal or monocrystal with a large particle size since the semiconductor forming the channel 40 area is processed by the laser beam irradiation technique described in connection with FIGS. 15A and 15B. Therefore, such a transistor has a higher switching speed than that of a transistor using an amorphous semiconductor which is not subjected to laser beam processing. Circuit designing can be performed so that the polycrystal or monocrystal transistor can have a liquid crystal drive function, a function of an integrated circuit such as a memory (SRAM, DRAM) or a CPU. A circuit requiring a dielectric strength is formed to the amorphous semiconductor film, and it is polycrystallized or monocrystallized with respect to a transistor of, e.g., a driver circuit which requires an increase in speed of the mobility.

As described above, according to the present invention, since the film like a phase shift mask which performs patterning of a light intensity and the processed substrate are distanced from each other by arranging the image forming optical system therebetween, the mask is not contaminated by ablation which occurs when irradiating the semiconductor film with the laser beam.

Furthermore, a sensor which measures a position can be inserted between the phase shift mask and the processed substrate, or a light beam for the sensor can be caused to enter between them.

Besides, the NA method according to the present invention has the following four advantages as compared with the conventional phase control ELA method or the defocus method according to the present invention.

At first, changes in a pattern are reduced even if the processed substrate moves forward and backward with respect to the optical axis or the surface of the semiconductor film is moved forward and backward due to undulations.

At second, even if a degree of scattering of the illumination light varies, changes in the pattern are small.

In particular, even if scattering is large, the contrast of the pattern is not deteriorated like the defocus method.

At third, the light intensity distribution has less undulations at positions other than the phase shift portion, and it is close to an ideal pattern.

At fourth, as to positioning of the processed substrate in the optical axis direction, simply holding the processed substrate on a focal plane can suffice without requiring a control over a defocus quantity like the "defocus method", thereby facilitating the control.

What is claimed is:

1. A crystallization apparatus comprising:
a light source which emits a light beam;
a mask which receives the light beam from the light source and makes an intensity distribution of the light beam into an inverse peak pattern that a peak value has a minimum intensity; and
an image forming optical system which is positioned between the mask and a processed substrate, and forms an image of the light beam having the inverse peak pattern on the processed substrate, thereby crystallizing at least a part of a substance of the processed substrate.

2. The crystallization apparatus according to claim 1, wherein the mask has a phase shift mask in which adjacent areas have different thicknesses and a phase shift portion having a step between these areas is defined.

3. The crystallization apparatus according to claim 2, wherein the a phase difference of the phase shift portion of the mask is 180° so as to produce a peak value of which the intensity is substantially zero.

4. The crystallization apparatus according to claim 1, further comprising a support which supports the processed substrate at a defocus position separated from a focal position of the image forming optical system by a predetermined distance.

5. The crystallization apparatus according to claim 1, further comprising a support which supports the processed substrate at a focal position of the image forming optical system, wherein the image forming optical system has an aperture whose NA can be changed so as to be capable of adjusting a width of the inverse peak pattern.

6. The crystallization apparatus according to claim 5, wherein assuming that $\lambda$ is a wavelength of the light beam and NA is a numerical aperture of the aperture, a width D of the inverse peak pattern is given by the following expression:

$D=k\lambda/NA$ ($k$ is a value from 0.5 to 2).

7. The crystallization apparatus according to claim 1, further comprising a support which supports the processed substrate at a focal position of the image forming optical system, wherein the image forming optical system has a pupil which sets a two-stage peak pattern having a first pattern positioned on a side where an intensity is low that an inverse peak pattern has a peak value, a second pattern positioned on a side where the intensity is high, and a step portion positioned between the first pattern and the second pattern so that a width of the first pattern is greater than a width of the second pattern.

8. The crystallization apparatus according to claim 7, wherein the pupil of the image forming optical system has a light transmission area and a light semi-transmission area surrounding the light transmission area and, assuming that D1 is a width of the first pattern of the two-stage inverse peak pattern, D2 is a width of the second pattern of the same, $\theta1$ is a diameter of the light semi-transmission area represented by an angle and $\theta2$ is a diameter of the light transmission area represented by an angle, a size of a distribution of an outgoing radiation pupil function of the pupil of the image forming optical system satisfies the following expressions:

$D1=k\lambda/\sin \theta1$ ($k$ is a value from 0.5 to 2)

$D2=k\lambda/\sin \theta2$ ($k$ is a value from 0.5 to 2).

9. The crystallization apparatus according to claim 1, wherein a mask pattern of the mask has a phase shift mask having an intersection consisting of at least three or more phase shift lines and an integral value of a complex transmittance of a circular area with the intersection at the center being substantially zero.

10. The crystallization apparatus according to claim 9, wherein each of the three or more phase shift lines has a phase difference being less than 180 degrees ($\pi$).

11. The crystallization apparatus according to claim 9, wherein the number of phase shift lines is four, and each of the phase shift lines has a phase difference of substantially 90 degrees.

12. A crystallization method comprising:
generating an inverse peak pattern having a peak value that a light intensity is substantially zero at a phase shift portion of a phase shift mask by using this mask; and
irradiating a processed substrate with a light beam having the inverse peak pattern, thereby crystallizing at least a part of a substance of the substrate,
wherein an image of the light beam of the phase shift mask is formed on the processed substrate by using an image forming optical system provided between the phase shift mask and the processed substrate.

13. The crystallization method according to claim 12, wherein an image of the light beam is formed with the processed substrate being held at a defocus position separated from a focal position of the image forming optical system by a predetermined distance, thereby achieving crystallization.

14. The crystallization method according to claim 12, wherein the processed substrate is held at a focal position of the image forming optical system, and
the inverse peak pattern is made into a two-stage inverse peak pattern in such a manner that an outgoing radiation pupil function of the image forming optical system becomes a sum of two types of large and small distributions of an outer area and an inner area, and the processed substrate is irradiated with the light beam, thereby achieving crystallization.

15. The crystallization method according to claim 13, wherein the processed substrate is held at a focal position of the image forming optical system, and
a width of the inverse peak pattern is adjusted by changing NA of the image forming optical system, and an image of the light beam is formed on the processed substrate, thereby achieving crystallization.

* * * * *